United States Patent
Guarneros Jones et al.

(10) Patent No.: US 9,497,868 B2
(45) Date of Patent: Nov. 15, 2016

(54) ELECTRONICS ENCLOSURE

(71) Applicant: Continental Automotive Systems, Inc., Auburn Hills, MI (US)

(72) Inventors: Johnathan Guarneros Jones, Tlajomulco de Zuñiga (MX); Ravi Kiran Kothamasa, Rochester Hills, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 142 days.

(21) Appl. No.: 14/298,383

(22) Filed: Jun. 6, 2014

(65) Prior Publication Data

US 2015/0305172 A1     Oct. 22, 2015

Related U.S. Application Data

(60) Provisional application No. 61/980,966, filed on Apr. 17, 2014.

(51) Int. Cl.
*H05K 5/00* (2006.01)
*H05K 5/06* (2006.01)
*H05K 5/02* (2006.01)

(52) U.S. Cl.
CPC .......... *H05K 5/0056* (2013.01); *H05K 5/0004* (2013.01); *H05K 5/0213* (2013.01); *H05K 5/06* (2013.01); *H05K 5/066* (2013.01)

(58) Field of Classification Search
CPC ............. H05K 5/0004; H05K 5/0026; H05K 5/0047; H05K 5/0056
USPC ....................................................... 174/522
See application file for complete search history.

(56) References Cited

U.S. PATENT DOCUMENTS

| | | | |
|---|---|---|---|
| 4,639,818 A | | 1/1987 | Cherian |
| 5,455,386 A | * | 10/1995 | Brathwaite ............. H01L 23/10 174/522 |
| 5,686,698 A | * | 11/1997 | Mahadevan .......... G01L 19/003 174/522 |
| 6,505,110 B1 | | 1/2003 | Yoshino |
| 7,253,356 B2 | * | 8/2007 | Kiyota ................... H02G 3/081 174/17 R |
| 8,218,297 B2 | * | 7/2012 | Nakamura ........... H05K 5/0047 174/522 |
| 2005/0194167 A1 | * | 9/2005 | Kiyota ................... H02G 3/081 174/17 VA |
| 2006/0070092 A1 | | 3/2006 | Russ |

(Continued)

FOREIGN PATENT DOCUMENTS

| | | |
|---|---|---|
| EP | 1313359 A2 | 5/2003 |
| EP | 1638380 A1 | 3/2006 |
| EP | 2480059 A1 | 7/2012 |

(Continued)

OTHER PUBLICATIONS

European Patent Office Search Report dated Sep. 17, 2015.

(Continued)

*Primary Examiner* — Adrian S Wilson

(57) ABSTRACT

An electronics housing assembly is provided. The assembly includes an electronics housing defining an internal cavity. The electronics housing defines an outer side, and the electronics housing having portions defining a vent hole therein. The vent hole extends through the outer side. A sealing element is disposed adjacent to the electronics housing and contacting the outer side. The sealing element covers the vent hole. A method for sealing an electronics housing assembly is also provided.

16 Claims, 5 Drawing Sheets

(56) References Cited

U.S. PATENT DOCUMENTS

2010/0133001 A1    6/2010  Loibl et al.
2011/0004576 A1    1/2011  Omura

FOREIGN PATENT DOCUMENTS

EP    2563107 A1    2/2013
GB    2489544 A    3/2012

OTHER PUBLICATIONS

Great Britain Intellectual Property Office Search Report dated Dec. 1, 2014.

Guarneros Jones, Jonathan, Overmolded ECU Device, U.S. Appl. No. 13/851,300, filed Mar. 27, 2013.

Godwin, James G; Moore, Kevin D, Electronics Module Enclosure Technical Field, U.S. Appl. No. 14/097,622, filed Dec. 5, 2013.

* cited by examiner

ELECTRONICS ENCLOSURE

CROSS-REFERENCE TO RELATED APPLICATIONS

This application claims the benefit of U.S. Provisional Application No. 61/980,966, filed on Apr. 17, 2014, which is incorporated by reference herein in its entirety.

TECHNICAL FIELD

The present disclosure relates generally to electronics enclosures, and more specifically to an electronics enclosure for use in an automotive powertrain system.

BACKGROUND

Modern vehicles, such as cars, incorporate electronic systems and controllers into the engine designs. The electronic systems enable proper operation of the engine and other vehicle systems during all operating conditions. Some operating conditions, such as rain or sleet, are hazardous to exposed electronics and can damage or destroy exposed electronics. In order to protect the electronic systems, typical vehicles isolate the electronic components from the environmental hazards by placing the electronics within an electronics housing module.

Electronics housing modules, or enclosures, include a housing body and a cover that seals the housing body. The sealed enclosure protects the electronics that are contained within from external contaminants. The housing body can further include sealed communication ports allowing the electronics module to be connected to sensors or other electric systems within the vehicle. Once the electronic components are situated within the housing module, the cover is placed on the module, thereby sealing the housing module.

The process of sealing the housing module can displace gasses, such as air, that are located within the housing module. In order to prevent the displaced gasses from damaging the seal while the seal is being applied or is curing, at least one vent hole is positioned on the housing module and allows gas to escape from the housing module during the sealing process. In order to ensure that the housing module is fully sealed, it is desirable to then seal the vent hole. In addition, such a vent hole may be used to test for leakage within the sealed housing.

In the past, engine control modules were cast, and vents were typically sealed by press-fitting another metal component into the vent hole. However, were the control module or other electronic module to be formed by another method, press-fitting a component into the vent hole may not provide an adequate sealing means.

SUMMARY OF THE INVENTION

Disclosed is an electronics housing that includes at least one element, such as an adhesive element, affixed over a vent hole of the electronics housing.

In one example, which may be combined with or separate from the other examples provided herein, an electronics housing assembly includes an electronics housing defining an internal cavity. The electronics housing defines an outer side. The electronics housing has portions defining a vent hole therein. The vent hole extends through the outer side. A sealing element is disposed adjacent to the electronics housing and contacting the outer side. The sealing element covers the vent hole.

In another example, which may be combined with or separate from the other examples provided herein, an engine control unit is provided that includes a housing defining an internal cavity. The housing defines an outer side. The housing has portions defining a vent hole therein. The vent hole extends through the outer side. A printed circuit board is disposed in the inner cavity of the housing. A sealing element is disposed adjacent to the housing and contacting the outer side. The sealing element covers the vent hole. The sealing element has a first side that is disposed adjacent to and contacting the outer side of the housing. The first side has an adhesive material disposed thereon. The adhesive material affixes the sealing element to the outer side of the housing.

In yet another example, which may be combined with or separate from the other examples described herein, a method for sealing an electronics housing assembly is provided. The method includes providing an electronics housing defining an internal cavity, wherein the electronics housing defines an outer side, the electronics housing has portions defining a vent hole therein, and the vent hole extends through the outer side. The method further includes affixing a sealing element over the vent hole and contacting the outer side.

These and other features of the present invention can be best understood from the following specification and drawings, the following of which is a brief description.

BRIEF DESCRIPTION OF THE DRAWINGS

The drawings are provided for illustrative purposes only and are not intended to limit the invention, as defined in the claims.

DETAILED DESCRIPTION OF AN EMBODIMENT

Figure 1:
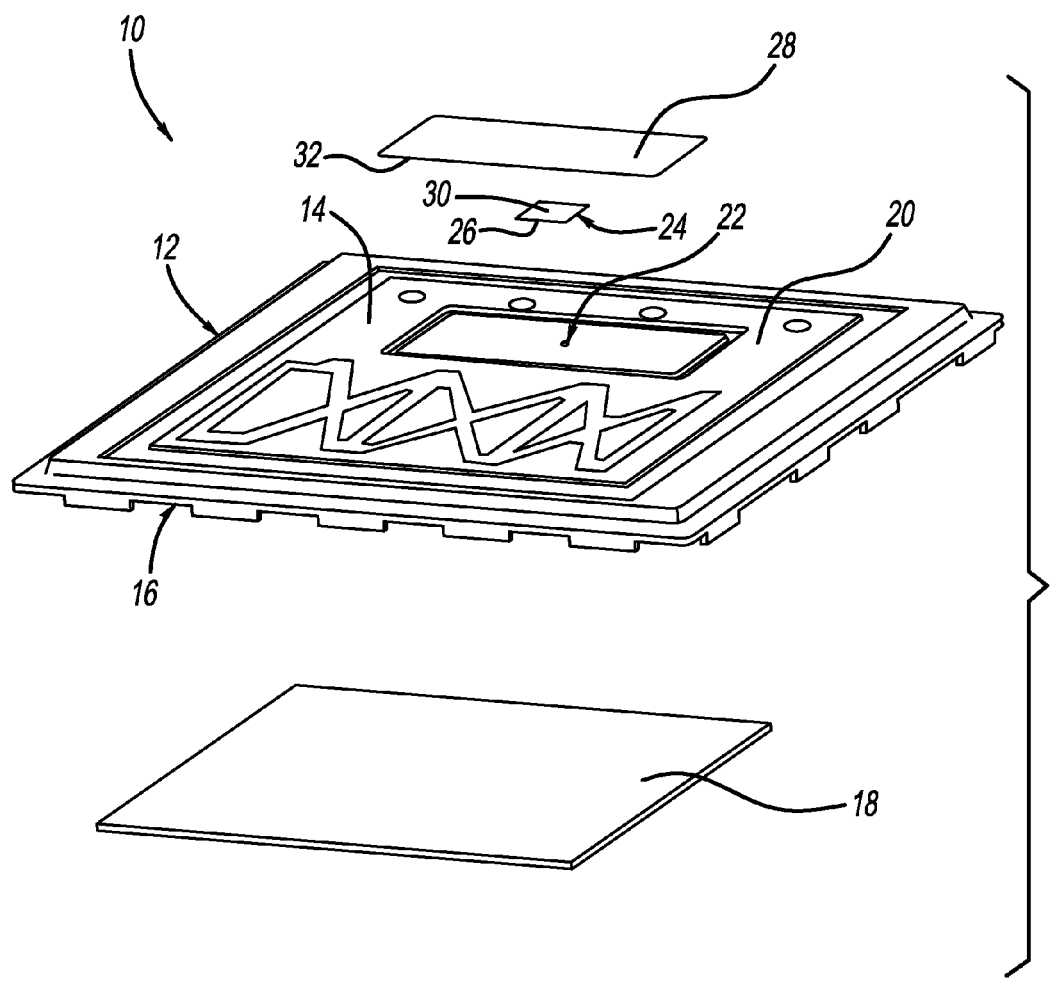
FIG. 1 is an exploded, perspective view of an electronics housing, in accordance with the principles of the present disclosure.
Figure 2:
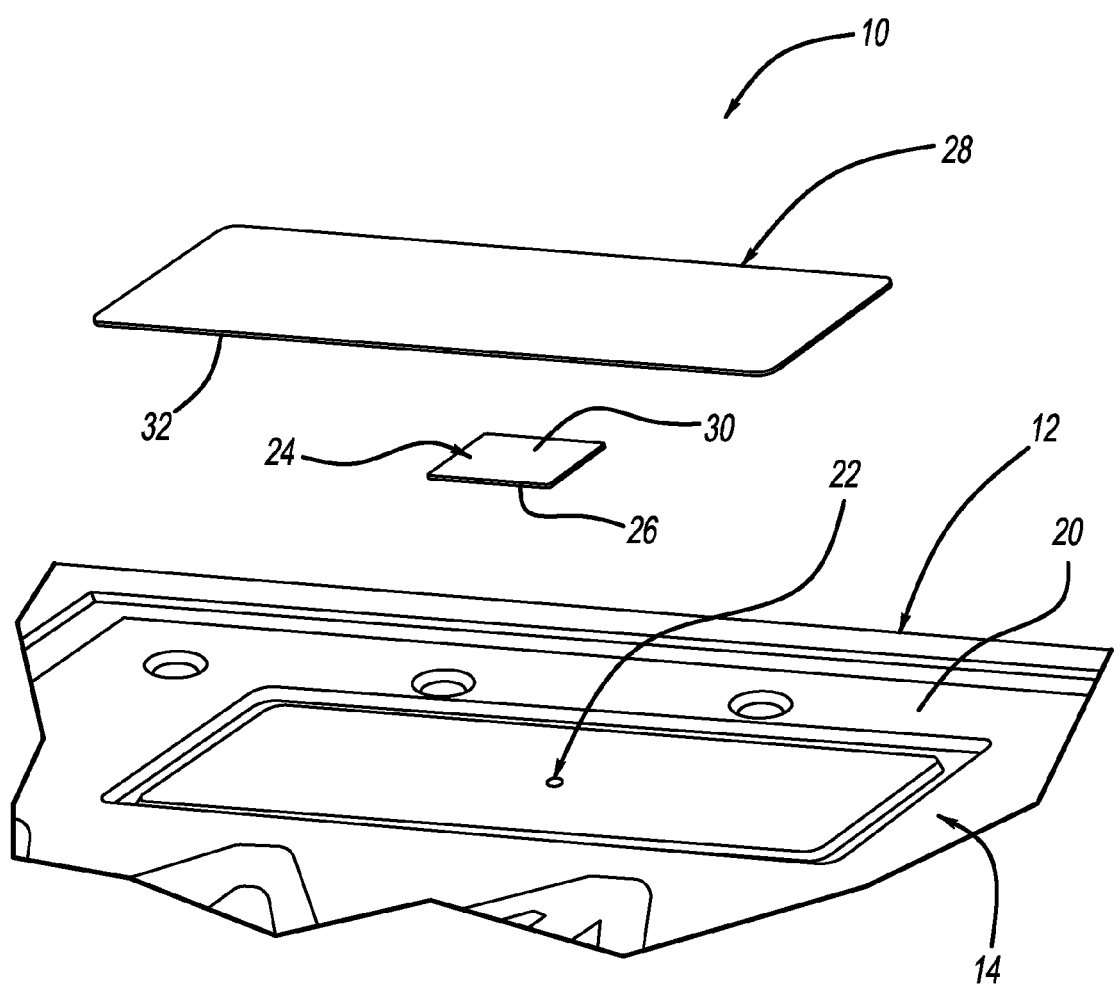
FIG. 2 is a close-up exploded, perspective view of a portion of the electronics housing of FIG. 1, showing a vent hole formed in the electronics housing, according to the principles of the present disclosure.

FIGS. 1-2 illustrate a partially exploded view of an electronics housing assembly, which is shown in an exploded view and generally designated at 10. The electronics housing assembly 10 includes an electronics housing 12 that defines an internal cavity therein. For example, the electronics housing may include a first enclosure portion 14 and a second enclosure portion 16, which are sealed together and cooperate to form the inner cavity therebetween. A printed circuit board 18 (shown exploded from the electronics housing 12 in FIG. 1) and/or other electronics components may be disposed within the internal cavity of the electronics housing 12. In some variations, the electronics housing assembly 10 may be an engine control unit (ECU), wherein the printed circuit board 18 forms part of an engine controller.

The electronics housing 12 has an outer side 20 and portions defining a vent hole 22 therein. The vent hole 22 extends through the outer side 20 and into the internal cavity of the electronics housing 12. The vent hole 22 may be used to test for leakage within the internal cavity of the housing 12, for example, after the first and second enclosure portions 14, 16 are fixed and sealed together to create the housing 12. The vent hole 22 may also allow for the displacement of gases within the internal cavity as the first and second enclosure portions 14, 16 are being sealed together and/or cured. A sealing element 24 is then used to seal the vent hole 22 so that the internal cavity of the electronics housing 12 is completely sealed to protect the electronics therein, such as the printed circuit board 18.

Figure 3:
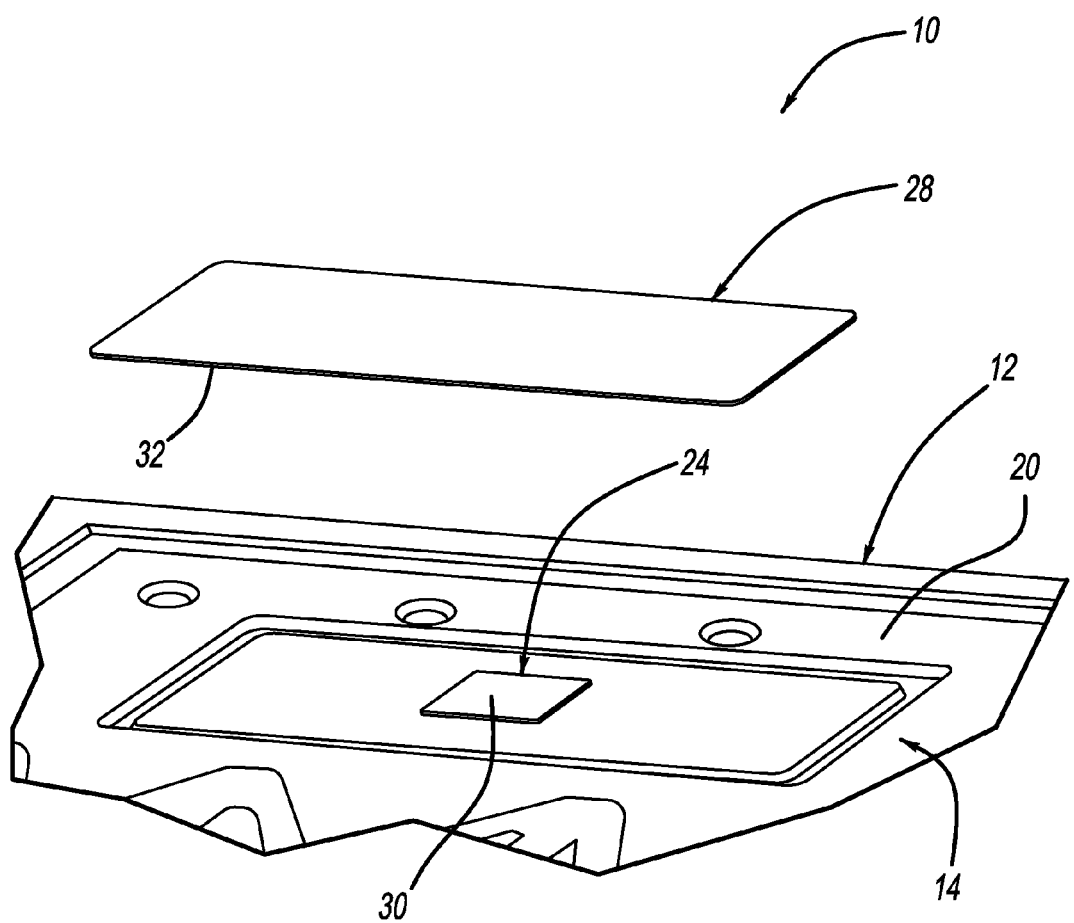
FIG. 3 is a partially assembled perspective view of the portion of the electronics housing of FIG. 1, showing the vent hole covered by a first element, in accordance with the principles of the present disclosure.

In the illustrated example, the sealing element 22 is a substantially flat adhesive foil that is secured to the outer side 20 of the electronics housing 12. With reference to FIG. 3, the sealing element 24 is disposed adjacent to the outer side 20 of the electronics housing 12 and contacting the outer side 20. When assembled, the sealing element 24 covers the vent hole 22. A first side 26 of the sealing element 24, which is illustrated as the underside in the orientation of FIGS. 1-2, is disposed adjacent to and contacting the outer side 20 of the electronics housing 12. The first side 26 may have an adhesive material disposed thereon, wherein the adhesive material affixes the sealing element 24 to the electronics housing 12. More specifically, the adhesive material disposed on the first side 26 of the sealing element 24 is configured to adhere to both the first side 26 and the portions of the outer side 20 of the electronics housing 12 that surround the vent hole 22. In some variations, the adhesive material disposed on the sealing element 24 may be an acrylic adhesive.

In some examples, the sealing element 24 may be formed of polyester or aluminum. The electronics housing 12 may be formed of stamped of aluminum or steel, by way of example. In other variations, the electronics housing 12 may be formed of, for example, die cast aluminum. The sealing element 24 seals the vent hole 22, thereby preventing environmental contaminants from entering the internal cavity through the vent hole 22, once the electronics housing assembly 10 is put into use.

Figure 4:
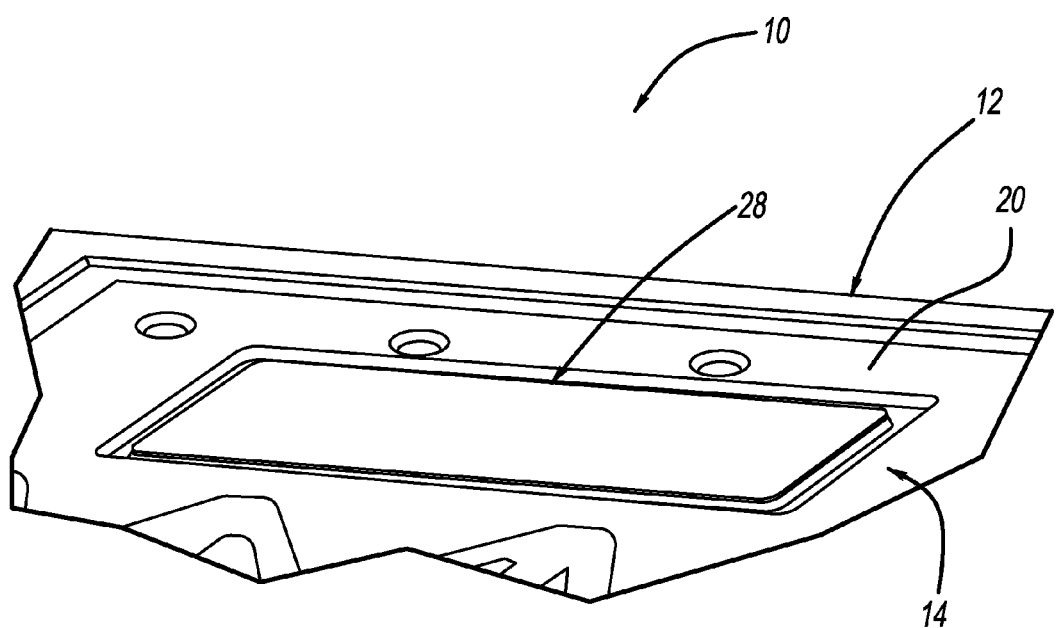
FIG. 4 is an assembled perspective view of the portion of the electronics housing of FIGS. 2-3, according to the principles of the present disclosure.

A label 28 is also disposed adjacent to and contacting the outer side 20 of the electronics housing 12 (see FIG. 4 for assembly view). The label 28 at least substantially covers (in this example, completely covers) the sealing element 24. More specifically, the sealing element 24 defines a second side 30 that is disposed opposite the first side 26. The label 28 is disposed adjacent to and contacting the second side 30 of the sealing element 24, wherein the label 28 substantially covers or completely covers the second side 30 of the sealing element 24. In the illustrated example, the label 28 is substantially flat and may be a manufacturer's label for labeling the engine control unit 10 or other electronics housing assembly 10.

The label 28 may also have an underside 32 that has an adhesive material disposed thereon, such as an acrylic adhesive, wherein the adhesive material is configured to affix the label 28 to the electronics housing 12. Thus, the adhesive material disposed on the underside 32 of the label 28 is configured to adhere the underside 32 of the label to the second side 30 of the sealing member 24 and the outer side 20 of the electronics housing 12.

Figure 5:
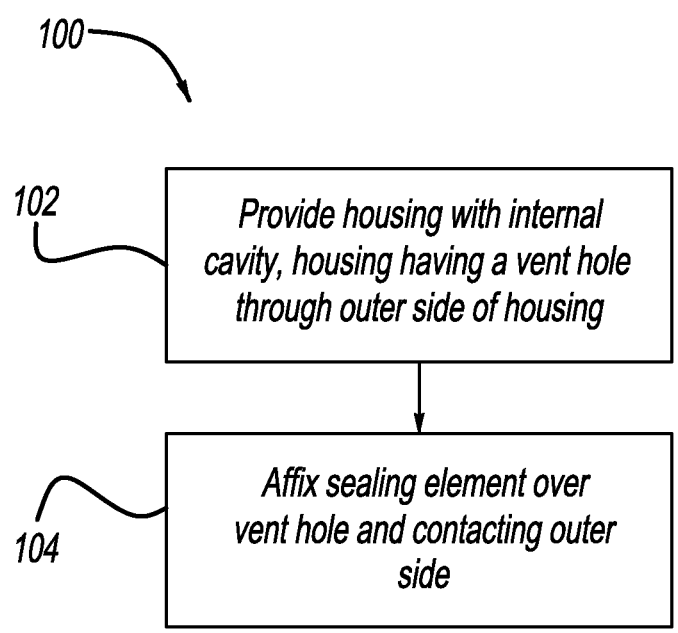
FIG. 5 depicts a method for sealing an electronic housing assembly in accordance with embodiments of the invention.

Referring now to FIG. 5, a method for sealing an electronics housing assembly illustrated and generally designated at 100. The method 100 includes a step 102 of providing an electronics housing defining an internal cavity, the electronics housing having an outer side, the electronics housing having portions defining a vent hole therein, and the vent hole extending through the outer side. For example, the electronics housing 12 illustrated in FIGS. 1-4 may be provided for step 102. The method 102 also includes a step 104 of affixing a sealing element over the vent hole and contacting the outer side.

In some variations, the method 100 the step 104 may include affixing the sealing element the outer side using an adhesive material. The method 100 may further include forming the sealing element from one of polyester and aluminum. In addition, the method 100 may include stamping the electronics housing from one of aluminum and steel. In other variations, the method 100 may include die casting the electronics housing from aluminum. The method 100 may also include affixing a label, such as label 28, to the outer side of the electronics housing and to the sealing element such that the label at least substantially covers the sealing element. The step of affixing the label may include affixing the label to the sealing element and the outer side of the electronics housing using an adhesive material. The method 100 may also include disposing a printed circuit board in the inner cavity.

In alternate examples, multiple vent holes 22 may be formed in the electronics housing 12 and sealed with the same sealing element 24 or additional similar sealing elements can be utilized to the same effect.

Furthermore, while the above examples are described individually, it will be understood by one of skill in the art having the benefit of this disclosure that an electronics module utilizing multiple vents can intermix different vent types in any combination, and the electronics housing assembly 10 of FIGS. 1-4 is not limited to a single example vent type.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

What is claimed is:

1. An electronics housing assembly comprising:
  an electronics housing defining an internal cavity, the electronics housing having an outer side, the electronics housing having portions defining a vent hole therein, the vent hole extending through the outer side;
  a sealing element disposed adjacent to the electronics housing and contacting the outer side, the sealing element covering the vent hole, wherein the sealing element has a first side that is disposed adjacent to and contacting the outer side of the electronics housing, the first side having an adhesive material disposed thereon, the adhesive material affixing the sealing element to the electronics housing;
  a label disposed adjacent to and contacting the outer side of the electronics housing, the sealing element defining a second side disposed opposite the first side, the label disposed adjacent to and contacting the second side, the label at least substantially covering the second side of the sealing element; and the adhesive material being a first adhesive material, the electronics housing assembly further comprising a second adhesive material disposed on an underside of the label, the second adhesive material affixing the label to the sealing element and the outer side of the electronics housing.

2. The electronics housing assembly of claim 1, wherein the sealing element is formed from one of polyester and aluminum.

3. The electronics housing assembly of claim 2, wherein the electronics housing is stamped of one of aluminum and steel.

4. The electronics housing assembly of claim 2, the sealing element being substantially flat.

5. The electronics housing assembly of claim 4, the label being substantially flat.

6. The electronics housing assembly of claim 1, the electronics housing assembly being an engine control unit, the electronics housing assembly further comprising a printed circuit board disposed in the internal cavity.

7. The electronics housing assembly of claim 6, the electronics housing comprising a first enclosure portion disposed adjacent to a second enclosure portion, the first and second enclosure portions being fixed together and defining the internal cavity.

8. An engine control unit comprising:
a housing defining an internal cavity, the housing having an outer side, the housing having portions defining a vent hole therein, the vent hole extending through the outer side;
a printed circuit board disposed in the inner cavity of the housing;
a sealing element disposed adjacent to the housing and contacting the outer side, the sealing element covering the vent hole, the sealing element having a first side that is disposed adjacent to and contacting the outer side of the housing, the first side having an adhesive material disposed thereon, the adhesive material affixing the sealing element to the outer side of the housing;
a label disposed adjacent to and contacting the outer side of the housing, the sealing element defining a second side disposed opposite the first side, the label disposed adjacent to and contacting the second side, the label at least substantially covering the second side of the sealing element; and
the adhesive material being a first adhesive material, the engine control unit further comprising a second adhesive material disposed on an underside of the label, the second adhesive material affixing the label to the sealing element and the outer side of the electronics housing.

9. The engine control unit of claim 8, wherein the sealing element is formed of one of polyester and aluminum.

10. The engine control unit of claim 9, wherein the housing is stamped from one of aluminum and steel.

11. The engine control unit of claim 10, the sealing element being substantially flat.

12. The engine control unit of claim 11, the label being substantially flat.

13. A method for sealing an electronics housing assembly, the method comprising the steps of:
providing an electronics housing defining an internal cavity, the electronics housing having an outer side, the electronics housing having portions defining a vent hole therein, the vent hole extending through the outer side;
using an adhesive material to affix a sealing element over the vent hole and contacting the outer side; and
the adhesive material being a first adhesive material, using a second adhesive material to affix a label to the outer side of the electronics housing and to the sealing element.

14. The method of claim 13, further comprising forming the sealing element from one of polyester and aluminum.

15. The method of claim 14, further comprising stamping the electronics housing from one of aluminum and steel.

16. The method of claim 15, further comprising disposed a printed circuit board in the inner cavity.

\* \* \* \* \*